United States Patent
Qian et al.

(10) Patent No.: US 10,723,614 B2
(45) Date of Patent: Jul. 28, 2020

(54) DEVICES WITH LOCALIZED STRAIN AND STRESS TUNING

(71) Applicant: VANGUARD INTERNATIONAL SEMICONDUCTOR SINGAPORE PTE. LTD., Singapore (SG)

(72) Inventors: You Qian, Singapore (SG); Humberto Campanella Pineda, Singapore (SG); Rakesh Kumar, Singapore (SG); Rajesh Nair, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/838,281

(22) Filed: Dec. 11, 2017

(65) Prior Publication Data

US 2019/0177155 A1 Jun. 13, 2019

(51) Int. Cl.
| | |
|---|---|
| *H01L 21/20* | (2006.01) |
| *G01C 19/56* | (2012.01) |
| *G01P 15/097* | (2006.01) |
| *B41J 2/05* | (2006.01) |
| *H01L 41/09* | (2006.01) |
| *H01L 41/22* | (2013.01) |
| *B81B 3/00* | (2006.01) |
| *B81C 1/00* | (2006.01) |

(52) U.S. Cl.
CPC ........ *B81B 3/0072* (2013.01); *B81C 1/00666* (2013.01); *B81B 2201/0214* (2013.01); *B81B 2201/0257* (2013.01); *B81B 2201/0264* (2013.01); *B81B 2203/0118* (2013.01); *B81C 2201/0143* (2013.01)

(58) Field of Classification Search
CPC ......... H01L 21/02505; H01L 21/02513; H01L 23/562; H01L 21/022; H01L 21/02164; H01L 21/0217; H01L 21/02186; H01L 21/02183; H01L 21/02178; H01L 21/02175; H01L 21/02274; H01L 21/02362; H01L 22/20; H01L 23/3192; H01L 23/3171; H01L 23/29; H01L 41/1136; H01L 41/22; C30B 33/00; C23C 16/345; C23C 16/402; C23C 16/06; C23C 16/513; H01S 5/0216; H01S 5/183; H02N 2/188

See application file for complete search history.

(56) References Cited

U.S. PATENT DOCUMENTS

| | | | |
|---|---|---|---|
| 5,666,446 A * | 9/1997 | Kragl | G02B 6/12004 385/14 |
| 6,073,337 A | 6/2000 | Strom | |
| 6,692,850 B2 | 2/2004 | Cook | |
| 6,929,721 B2 | 8/2005 | Bifano | |

(Continued)

*Primary Examiner* — Brian Turner
(74) *Attorney, Agent, or Firm* — Winston Hsu

(57) ABSTRACT

A device, such as a MEMS device, with stress tuning to achieve a desired stack stress across the wafer. The stress tuning includes trimming a stress compensation layer over a target layer having different stresses in different target layer regions. The trimming may include ion beam trimming to produce a stress compensation layer having different thicknesses over the different target layer regions to balance the stress of the target layer to a desired stress. The desired stress may result in almost zero residual stress to produce an almost flat MEMS device.

9 Claims, 19 Drawing Sheets

(56) References Cited

U.S. PATENT DOCUMENTS

| | | | |
|---|---|---|---|
| 2002/0050882 A1* | 5/2002 | Hyman | H01H 1/0036 335/78 |
| 2004/0090495 A1* | 5/2004 | Delametter | B41J 2/14427 347/56 |
| 2004/0152211 A1* | 8/2004 | Majumdar | G01N 33/54373 436/518 |
| 2009/0009030 A1* | 1/2009 | Freidhoff | H01H 57/00 310/314 |
| 2009/0256236 A1* | 10/2009 | Smeys | B81B 3/0072 257/531 |
| 2012/0056308 A1* | 3/2012 | Perruchot | B81C 1/00666 257/618 |
| 2012/0266686 A1* | 10/2012 | Huffman | G01L 9/0013 73/826 |
| 2015/0280688 A1 | 10/2015 | Ortiz et al. | |
| 2016/0005698 A1* | 1/2016 | Kim | H01L 25/105 257/686 |
| 2016/0172214 A1* | 6/2016 | Baloglu | H01L 23/3121 257/787 |
| 2016/0203971 A1* | 7/2016 | Tsiang | H01L 21/0217 257/640 |
| 2017/0162522 A1* | 6/2017 | Chang | H01L 21/02505 |
| 2019/0006136 A1* | 1/2019 | Rinaldi | B81B 3/0029 |
| 2019/0110132 A1* | 4/2019 | Littrell | B81B 3/0048 |

\* cited by examiner

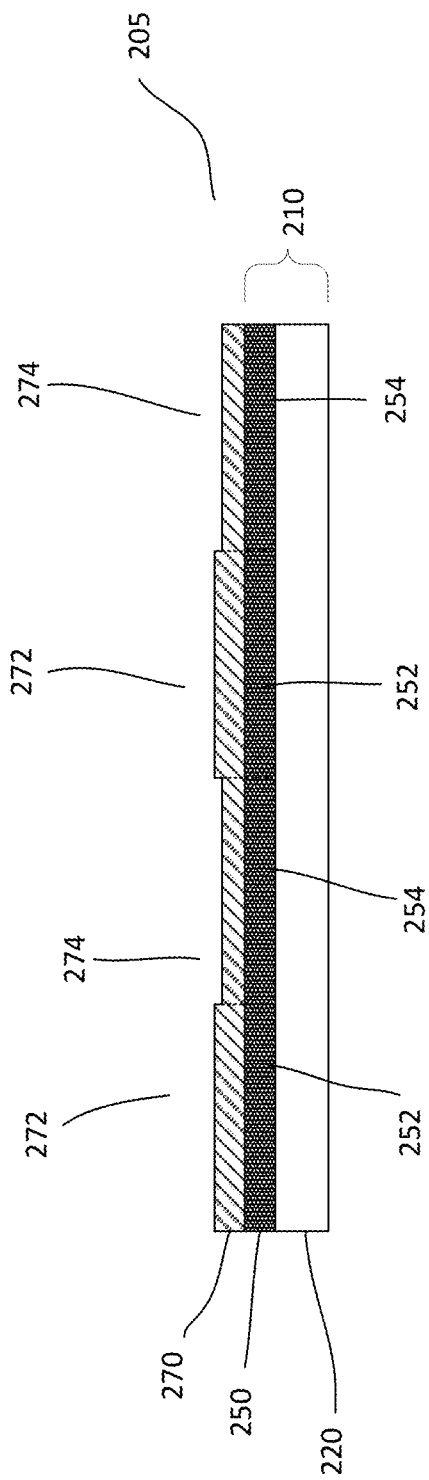

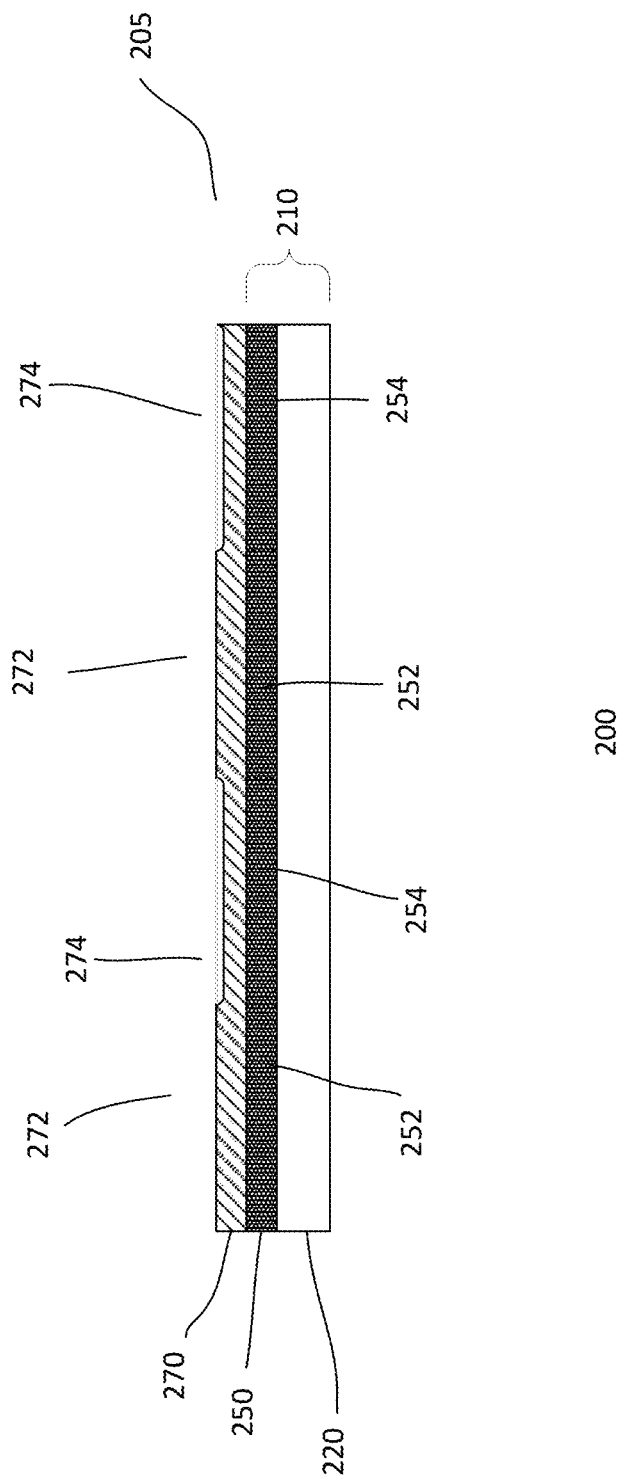

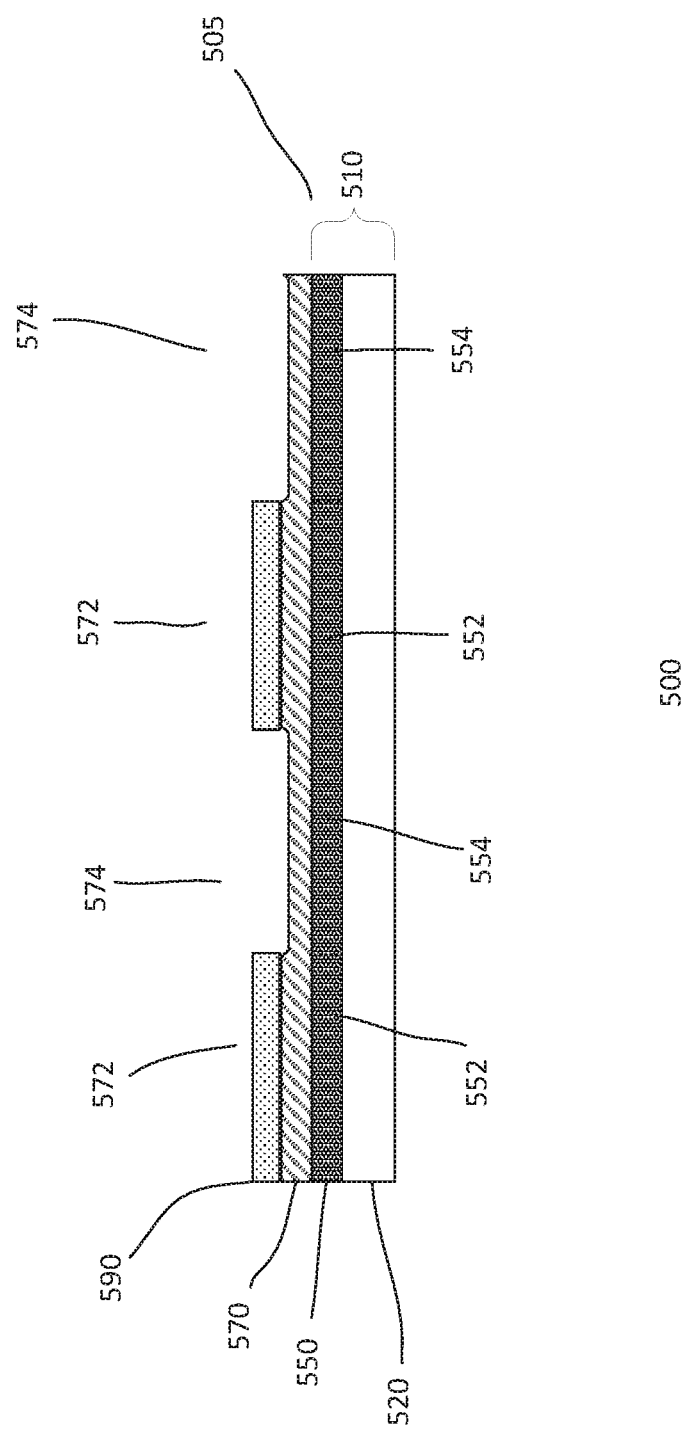

DEVICES WITH LOCALIZED STRAIN AND STRESS TUNING

FIELD OF THE INVENTION

The present disclosure generally relates to devices with localized strain and stress tuning. The devices, more specifically, relate to microelectromechanical system (MEMS) devices with localized strain and stress tuning.

BACKGROUND

Devices, such as microelectromechanical system (MEMS) devices, have numerous applications, such as sensors, microphones and filters. MEMS devices include free-standing structures. For example, MEMS devices include free-standing structures with arbitrary clamping and geometries, such as cantilever structures. However, a major problem encountered with conventional MEMS devices is residual stress in the free-standing structures of the MEMS devices. Residual stress may result in bending, buckling or even failure in the release of the free-standing structure, depending on the stress. Furthermore, conventional processes for forming MEMS devices result in highly non-uniform stress distribution across the wafer map. The variation may be due to variations in process conditions across the wafer. The variation in stress affects the free-standing structures of the MEMS devices differently, depending on the stress at the location of the wafer. Such high non-uniformity in the stress distribution across the wafer undesirably contributes to a large variation in device performance, including failures. This negatively affects reliability and yields.

The present disclosure is directed to MEMS devices with localized strain and stress tuning to improve reliability and yields.

SUMMARY

Embodiments generally relate to devices and methods for forming a device. In one embodiment, a device with a device structure is disclosed. A wafer on which a plurality of devices are disposed is provided. The device includes a device stack of the device structure. The device stack includes a target layer and a stress compensation layer disposed over the target layer. The target layer includes a non-uniform distribution of stress across the wafer. The non-uniform distribution of stress includes at least a first target layer region with a first target layer stress, and a second target layer region with a second target layer stress. The first and second target layer stresses have first and second target layer stress magnitudes which are different. The stress compensation layer is configured to balance the target layer with a non-uniform distribution of stress across the wafer in the first and second target regions to about a desired stack.

In another embodiment, a method of forming a device is disclosed. The method includes providing a wafer having a plurality of devices. A target layer of a device structure is formed on the wafer at wafer level. The target layer includes a non-uniform stress distribution across the wafer with target layer regions having different stress magnitudes. Target layer thickness and target layer stress are measured in different target layer regions of the target layer across the wafer. A stress compensation layer is formed on the target layer at wafer level. The stress compensation layer and target layer form a device stack. A thickness of the stress compensation layer and a compensation stress of the stress compensation layer are locally measured across the wafer to obtain local thickness and local compensation stress of the stress compensation layer across the wafer. The stress compensation layer is locally trimmed to configure the stress compensation layer to balance the target layer with non-uniform stress distribution across the wafer to about a desired stack stress of the device stack across the wafer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 2a-2c show cross-sectional views of various embodiments of a portion of a device;

FIGS. 5a-5d show cross-sectional views of yet another embodiment of a process for forming a device.

DETAILED DESCRIPTION

Embodiments generally relate to devices. More particularly, embodiments relate to microelectromechanical systems (MEMS) devices. Other types of devices may also be useful. The MEMS devices can be incorporated into, for example, pressure sensors and biosensors in medical instruments, inductors and tunable capacitors in high frequency circuits, microphones, and inertial sensors in automobiles. Incorporating the devices in other applications may also be useful.

Figure 1A:
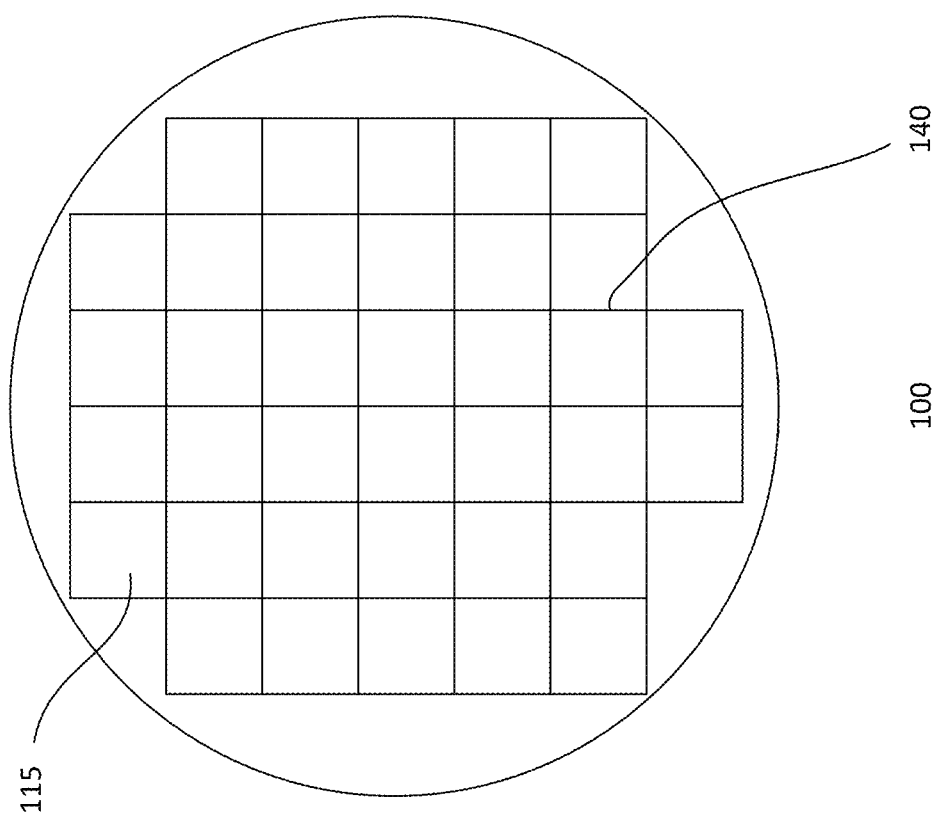
FIG. 1a shows a plan view of a wafer with a plurality of devices.

FIG. 1a shows a plan view of a wafer 100. The wafer, for example, may be a semiconductor wafer, such as a silicon wafer. Other types of wafers are also useful. For example, the wafer may be a silicon-on-insulator (SOI) wafer.

The wafer is processed to form a plurality of devices 115 in parallel. The devices, in one embodiment, are microelectromechanical system (MEMS) devices. Other types of devices may also be useful. As shown, the devices are rectangular or square shaped devices arranged in rows and columns. Since the wafer is circular in shape, the devices are arranged to maximize the number of integrated circuits (ICs) on the wafer. Between the rows and columns of devices is a kerf region 140. The kerf region is sufficiently wide to accommodate a wafer saw used to dice the wafer. This avoids damaging devices.

As discussed, a device, such as a MEMS device, includes a free-standing structure. The free-standing structure may include a cantilever or a clamped structure. Other types of free-standing structures may also be useful.

Figure 1B:
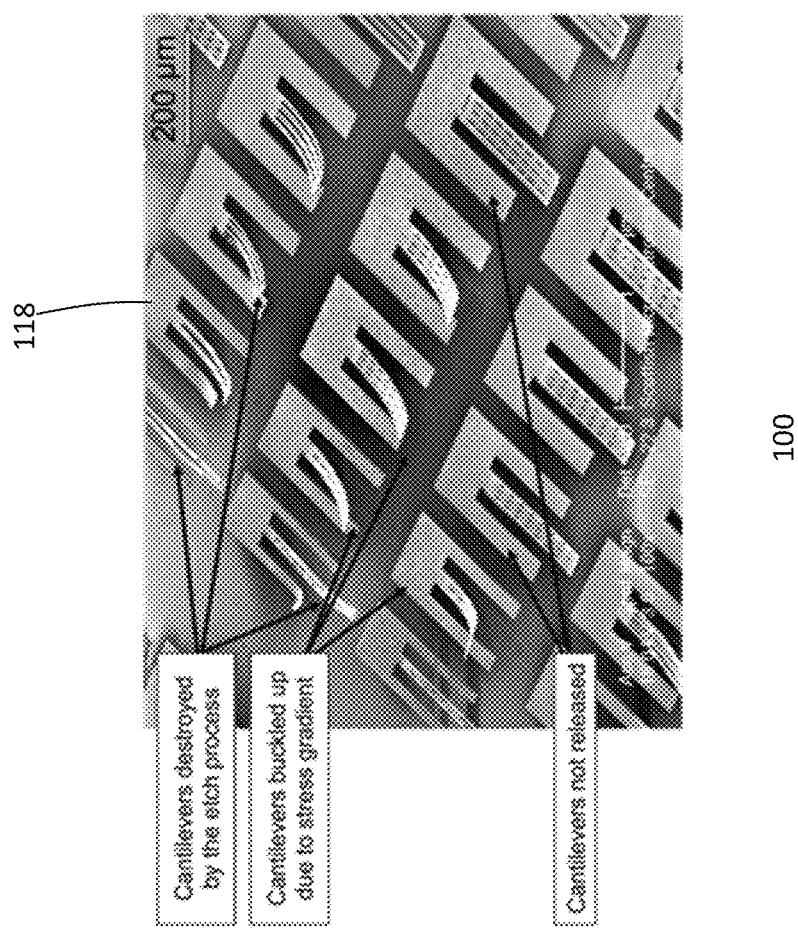
FIG. 1b shows a portion of a wafer with a plurality of conventional MEMS devices having free-standing structures.

FIG. 1b shows a portion of a wafer 100 with a plurality of conventional MEMS devices with free-standing structures 118. A MEMS device may include one or more free-standing structures, depending on the type of MEMS device. As shown, the free-standing structures are cantilever structures. As discussed, conventional MEMS devices may suffer from a variety of strain or stress related failures. See, e.g., Schiavone, Giuseppe, et al., "Fabrication of electrodeposited Ni—Fe cantilevers for magnetic MEMS switch applications", Journal of Microelectromechanical Systems 24.4 (2015): 870-879. Due to process variations, different locations of a wafer may experience different residual stresses. For example, localized stress across the wafer or wafer map may be different. This may result in various issues, such as some cantilever structures buckling, destroyed by the etch process as well as failure to being released. Variations in localized stress negatively affect yields of the MEMS devices.

FIG. 2a shows a cross-sectional view of an embodiment of a portion of a device 200. The device may be a MEMS device. Other types of devices may also be useful. The device may be disposed or formed on a substrate. The substrate may be a silicon wafer on which numerous MEMS devices are formed. Other substrates may also be useful. The substrate, for example, may be silicon-on-insulator, germanium, silicon carbide, glass, quartz or other types of wafers. The MEMS device, for example, is disposed on the substrate. The substrate should be sufficiently thick to support the MEMS device. For example, the substrate may include a thickness of about 750 µm. Other thicknesses may also be useful.

As shown, the portion of the device 200 includes a device stack 205 of a device component. The device component may be a MEMS component of a MEMS device. The MEMS component may be a sensor, resonator, accelerometer, microphone, magnetic switch, thin film head (TFH), energy harvester, or a filter, such as a surface acoustic wave filter (SAW) or bulk acoustic wave (BAW) filter. Other types of MEMS components may also be useful. The MEMS component, in one embodiment, includes a free-standing structure with arbitrary clamping and geometry. In one embodiment, the MEMS component is a cantilever structure. Other types of free-standing structures may also be useful, depending on the type of device component. A cantilever, for example, is an elongated member having a length with sides and first and second ends. A first end of the cantilever is attached to the substrate while the sides and the second end are released or separated from the substrate.

The MEMS stack 205 includes a target layer 210 and a stress compensation layer 270. The target layer may be an active layer of the MEMS component. The term "target layer" may be referred to as a single layer or a stack with multiple target layers. Various types or numbers of target layers may be used, depending on the type of MEMS components. Examples of target layers may include aluminum nitride (AlN), aluminum oxide ($Al_2O_3$), tantalum (Ta), silicon (Si), silicon nitride ($Si_3N_4$), silicon oxide ($SiO_2$), ruthenium (Ru), tungsten (W), molybdenum (Mo), copper (Cu), nickel iron (NiFe), cobalt nickel iron (CoNiFe), glass, quartz, lithium tantalum oxide ($LiTaO_3$), lithium niobium oxide ($LiNbO_3$), silicon chromium (SiCr), tungsten carbide (WC), zinc oxide (ZnO), or a combination thereof.

The target layer, illustratively, is a target stack which includes first and second target layers 220 and 250. Providing a target layer with other number of target layers may also be useful. The first and second target layers may be elastic layers. For example, the first target layer may be a Si layer. The first target layer may be stress neutral or without stress. The second target layer may include stress. The second target layer may be an AlN layer. For example, the target stack may be a Si/AlN target stack. The thickness of the Si layer may be about 3 µm and the thickness of the AlN layer may be targeted at about 1 µm (e.g., target thickness=1 µm). Other thickness or configurations of first and second target layers of the target stack may also be useful.

In other embodiments, for example, the target layer may be a Mo/AlN/Mo/AlN stack. The thickness of the AlN layers may be about 500 nm and the thickness of the Mo layers may be about 20 nm. In yet other embodiments, the target layer may be a $SiO_2$/Si/Mo/AlN/Mo stack. The $SiO_2$ and Si of the target stack may be a part of a SOI substrate. The $SiO_2$ layer may be about 500 nm, the thickness of the Si layer may be about 6 µm, the thickness of the first Mo layer may be about 200 nm, the thickness of the AlN layer may be about 800 nm, and the thickness of the second Mo layer may be about 100 nm. Other thicknesses or configurations of the target layers may also be useful, depending on the MEMS component.

The stress of the second target layer may be any type of stress. For example, the stress of the target layer may be compressive or tensile. The magnitude of the stress may depend on the material and thickness of the target layer. Generally, tensile stress may be denoted by a "+" or no sign, and compressive stress may be denoted by a "−" sign. As for the magnitude, it is denoted by a number with the unit being pascal (Pa).

A target layer may be deposited with a target thickness. The target layer may have variations of stress across the wafer. The stress variations may be caused by inherent process condition variations across the wafer. The stress variations result in a non-uniform distribution of stress in the target layer across the MEMS components as well as across the wafer.

As discussed, the target layer may be deposited with a target thickness. However, the thickness of the target layer may also have variations across the wafer. For example, the thickness of the target layer may vary ± from the target thickness. The thickness variations of the target layer may cause or contribute to non-uniform stress distribution across the wafer.

As an example, an AlN target layer may be a tensile stress layer. An AlN target layer with a target thickness may have a stress distribution of about 140-160 MPa across the wafer. The target layer may have other distributions of types and magnitude of stress. The non-uniform distribution, as discussed, creates problems, negatively affecting yields.

In an illustrative embodiment, the second target layer which is deposited over a first target layer includes first and second stress regions 252 and 254 with different stress magnitudes. For example, the second target layer may include a first set of target layer regions with the first target stress magnitude and a second set of target layer regions with the second target stress magnitude. The second target layer may be an AlN layer deposited over a first target layer which may be a Si layer. The AlN layer may be deposited with a target thickness of 1 µm. The first target layer regions may have a measured stress of 160 MPa and the second target layer regions may have a measured stress of 150 MPa. Other types of target layers, target thicknesses and stress magnitudes for different stress regions may also be useful. In the exemplary embodiment, the target layer is illustrated with first and second stress regions having different stresses across the wafer. However, it is understood that a target layer may have other number of stress regions with different stresses.

Determining the target layer stress may be achieved by locally measuring its stress across the wafer. Various stress measuring techniques may be employed. For example, the thickness and curvature of a layer across the wafer are measured. The curvature may be measured using a laser. Using the thickness and curvature information, the stress of the target layer may be calculated locally in different regions across the wafer. The stress measurements may be performed prior to and after deposition of a target layer. For example, based on the pre-deposition and post-deposition measurement data, the stress data of the target layer can be locally determined across the wafer. Other techniques for determining stress information may also be useful.

The stress compensation layer 270 is disposed over the target layer 210. The stress compensation layer includes a compensation stress for locally tuning the stress of the target layer. In one embodiment, the compensation stress of the stress compensation layer is configured to locally tune the non-uniformly distributed target layer stress of the target layer across the MEMS components and across the wafer to result in about a desired stack stress. For example, the MEMS stack can be tuned by the stress compensation layer to have about a desired stack stress for the MEMS stack across the wafer.

In one embodiment, the stress compensation layer tunes the MEMS stack to locally control the stress across the wafer. By locally controlling the thickness of the stress compensation layer across the wafer, the stress compensation layer can produce uniform deflection for free-standing structures for the MEMS devices across the wafer. For example, deflection of the free-standing structures across the wafer may be within about 0.5 µm. In one embodiment, the stress compensation layer tunes the MEMS stack to result in almost flat free-standing structures (within about 0.5 µm) for the MEMS devices across the wafer. For example, the stress compensation layer tunes stress of the MEMS stack locally to have almost zero residual stress across the wafer. To determine the thickness of the stress compensation needed at the different locations, the thickness and stress of each underlying layer are calculated at the different locations. Using the thickness and stress of the underlying layers at the different locations the thickness of the stress compensation layer at the different locations can be determined. Tuning the MEMS stack to result in other uniform deflections for the free-standing structures may also be useful. The ability to tune the stress of the MEMS stack to locally control the stress across the wafer produces the free-standing structures of the MEMS devices with about the same bend. This produces uniformity in device performance of devices across the wafer.

In one embodiment, the stress compensation layer has a compensation layer stress which is opposite to that of the target layer stress. For example, if the target layer has a tensile stress, then the stress compensation layer is chosen to have a compressive stress, and vice versa.

The compensation layer stress depends on the thickness and material of the stress compensation layer. The thickness and material of the stress compensation layer are selected to produce sufficient stress to compensate for the different target layer stresses to result in a MEMS stack with a desired stack stress. In one embodiment, the thickness of the stress compensation layer should be sufficient to balance the stress to achieve the desired deflection across the wafer. In one embodiment, the thickness of the stress compensation layer is selected to balance the highest target layer stress. Providing a stress compensation layer which is thicker than necessary to balance the highest target layer stress may also be useful.

The stress compensation layer may, for example, be a SiN layer. Other suitable compensation stress layers may also be used, depending on the requirements and functionality of the device. In some cases, the top layer of the target layer may serve as a stress compensation layer. For example, if the top layer of a target layer has the same type of stress as the stress compensation layer, it may serve as a compensation stress layer. As an example, if the stress compensation layer is a compressive stress layer and if the top layer of the target layer is a SiN layer, it can serve as a compensation layer. As such, the stress compensation layer may be integrated as part of the target layer.

The stress compensation layer is configured to balance the stress in the different regions of the target layer to produce about a desired stack stress value. For example, the stress compensation layer may be configured to produce an almost zero residual stress in the different target layer regions to result in almost zero deflection across the wafer. Configuring the stress compensation layer to produce other desired stack stress values may also be useful. For example, the stress compensation layer may be configured to produce non-flat free-standing structures with uniform deflections across the wafer.

In one embodiment, as discussed, the stress compensation layer, as deposited, has a thickness which is tailored to balance the target layer stress to the desired stack stress value in the target layer region with the highest target layer stress. For example, the stress compensation layer balances the target layer stress in the first target layer regions. As for the other target layer regions, the stress compensation layer is processed to balance the target layer stress in those regions. Processing includes trimming the stress compensation layer appropriately to balance the target layer stress in the other target layer regions.

In other embodiments, the stress compensation layer, as deposited, is greater in thickness than necessary to balance the target layer stress to the desired stack stress value in the target layer region with the highest target layer stress. The stress compensation layer is trimmed in the various regions to balance the target layer stress to the desired stack stress value. For example, first and second target layer regions are trimmed appropriately.

In one embodiment, trimming reduces the thickness of the stress compensation layer to balance the target layer stress in the other target layer regions. For example, trimming reduces the stress of the stress compensation layer to balance the target layer stress in the other target layer regions. The trimming produces an overall compensation layer stress to balance the target layer stress in the desired target layer region. The trimming may be uniform or non-uniform within a target layer region. For example, the stress compensation layer may be trimmed to provide a uniform recess 274 extending substantially coextensive to a corresponding target layer region, such as the second target layer region 254. It is to be appreciated that the stress compensation layer may also be trimmed to provide non-uniform recesses, or recesses that are non-coextensive to the corresponding target layer region, depending on the target layer stress. The amount of stress compensation layer trimmed depends on the amount of stress which needs to be compensated for or balanced. Trimming results in the stress compensation layer having a non-uniform thickness, such as having mesas 272 and recesses 274. For example, the stress compensation layer may have a non-planar topography or uneven top surface, such as a stepped top surface, across the wafer. In other embodiments, the trimming results in the stress compensation layer having a gradually changed thickness across the wafer.

Trimming, in one embodiment, is achieved using ion beam trimming. Ion beam trimming may be maskless. For example, the target layer stress is measured across the wafer, developing a wafer map. The calculations for spatially trimming the stress compensation layer can be determined by the wafer map. For example, the trimming parameters may be programmed into the ion beam trimming tool, spatially trimming the stress compensation layer across the wafer map based on the calculations, such as amount and spatial location of stress. In other embodiments, trimming by ion beam trimming may be employed using a mask, such as a patterned photoresist mask. In other embodiment, trimming may be achieved using mask and etch techniques. For example, an anisotropic etch, such as reactive ion etch (RIE) or an isotropic etch, such as a wet etch, is employed using a patterned resist mask to selectively trimmed the stress compensation layer. Furthermore, the trimming may be achieved using multiple trimming processes to achieve the desired stack stress across the wafer.

As described, the stress compensation layer can be employed with any type of MEMS stack. The trimming of the stress compensation layer achieves about a global desired stack stress across the wafer. For example, the stress compensation layer can be trimmed to achieve almost global zero residual stress across the wafer to result in almost flat free-standing structures. The compensation can be easily and cheaply integrated into current processes. This improves the performance, reliability and yield of MEMS device inexpensively.

Figure 2B:
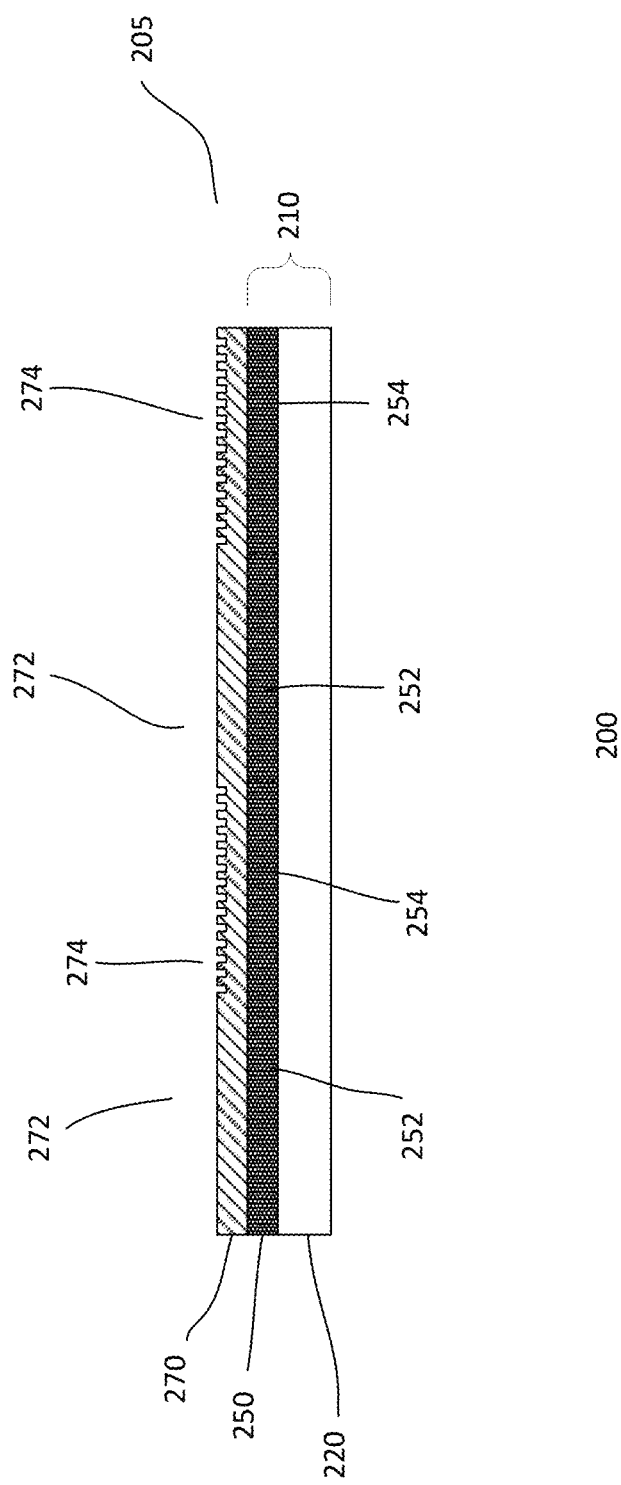

FIG. 2b shows a cross-sectional view of another embodiment of a portion of a device 200. In one embodiment, the device is a MEMS device. The device, for example, is similar to that described in FIG. 2a. Common elements may not be described or described in detail.

As shown, the portion includes a MEMS stack 205 of a MEMS component, such as a free-standing structure with arbitrary clamping and geometry. The MEMS component, for example, may be a cantilever structure. Other types of free-standing structures may also be useful, depending on the type of MEMS component.

The MEMS stack 205, in one embodiment, includes a target layer 210 and a stress compensation layer 270. Providing the MEMS stack with other layers may also be useful. The target layer may include first and second target layers 220 and 250. The first target layer may be a Si layer, and the second target layer may be an AlN layer. Other configurations of target layers may also be useful. The target layer, for example, includes first target layer regions 252 with a first target layer stress magnitude and second target layer regions 254 with a second target layer stress magnitude. Providing other configurations of target layer stress for different regions in the target layer may also be useful.

The stress compensation layer is disposed over the target layer. The stress compensation layer includes a compensation stress for tuning the stress of the target layer. In one embodiment, the compensation stress of the stress compensation layer is configured to tune the non-uniformly distributed target layer stress of the target layer across the MEMS component and across the wafer to result in about a desired stack stress locally and globally. For example, the MEMS stack can be tuned by the stress compensation layer to have about a desired stack stress for the MEMS stack across the device and across the wafer.

The stress compensation layer may be configured to balance the stress in the different regions of the target layer to produce the desired stack stress value by locally controlling the thickness of the stress compensation layer corresponding to the different stress regions of the target layer. For example, the stress compensation layer may be configured to produce an almost zero residual stress in the different target layer regions to result in almost flat free-standing structures across the wafer. Configuring the stress compensation layer to produce other desired stack stress values may also be useful.

In one embodiment, as discussed, the stress compensation layer, as deposited, has a thickness which is tailored to balance the target layer stress to the desired stack stress value in the target layer region with the highest target layer stress. For example, the stress compensation layer balances the target layer stress in the first target layer regions. As for the other target layer regions, such as the second target layer regions, the stress compensation layer is processed to balance the target layer stress in those regions. Processing includes trimming the stress compensation layer appropriately to balance the target layer stress in the other target layer regions.

In one embodiment, trimming the stress compensation layer to balance a target layer region, such as a second target layer region, is performed non-uniformly. For example, the stress compensation layer in the compensation layer region 274 overlapping the corresponding second target layer region 254 is trimmed to form a grated pattern, as shown. The grated pattern includes mesas and recesses or trenches in the stress compensation layer, forming a trimmed topography in the stress compensation layer over the desired target layer region 254. The grating may be configured to be along a direction of the MEMS structure or perpendicular to the direction of the MEMS structure. In the case of a cantilever, the grating may be configured for directional tuning purposes. For example, the cantilever having a grating along the direction of the cantilever member is more rigid than the cantilever having a grating across the direction of the cantilever member. Other configurations of grating may also be useful. For example, grated patterns are formed in the selected compensation layer regions 274 to balance the target layer stress in the second target regions 254. As for compensation layer regions 272 overlapping the first target layer regions 252, there is no need for trimming since the layer is already tailored to balance the target layer stress in the first target layer regions.

In the case that one or more of the first target regions is a non-releasing area, the stress compensation layer corresponding to these regions may not need to be trimmed. Although, as shown, the target layer includes first and second target layer regions across the wafer, it is understood that the target layer may include other number of target layer regions. In this case, the regions of the stress compensation layer corresponding to the regions other than the first and second target layer regions may be trimmed to have the same grated patterns as the compensation regions 274 but with different depths. For example, the grated patterns of these regions may have shallower or deeper recesses than the compensation regions 274.

In other embodiments, the stress compensation layer, as deposited, is greater in thickness than necessary to balance the target layer stress to the desired stack stress value in the target layer region with the highest target layer stress. The stress compensation layer is trimmed in the various regions to balance the target layer stress to the desired stack stress value. For example, the compensation layer regions 272 and 274 are trimmed to form grated patterns to balance the target layer stress in the target layer 210. Trimming to form the grated pattern is achieved using ion beam trimming with a pattern resist.

FIG. 2c shows a cross-sectional view of another embodiment of a portion of a device 200. In one embodiment, the device is a MEMS device. The device, for example, is similar to that described in FIGS. 2a-2b. Common elements may not be described or described in detail.

As shown, the portion includes a MEMS stack 205 of a MEMS component, such as a free-standing structure with arbitrary clamping and geometry. The MEMS component, for example, may be a cantilever structure. Other types of free-standing structures may also be useful, depending on the type of MEMS component.

The MEMS stack 205 may include a target layer 210 and a stress compensation layer 270. Providing the MEMS stack with other layers may also be useful. The target layer may include first and second target layers 220 and 250. The first target layer may be a Si layer, and the second target layer may be an AlN layer. Other configurations of target layers may also be useful. The target layer, for example, includes first target layer regions 252 with a first target layer stress magnitude and second target layer regions 254 with a second target layer stress magnitude. Providing other configurations of target layer stress for different regions in the target layer may also be useful.

The stress compensation layer 270 is disposed over the target layer 210. The stress compensation layer includes a compensation stress for tuning the stress of the target layer. In one embodiment, the compensation stress of the stress compensation layer is configured to tune the non-uniformly distributed target layer stress of the target layer across the MEMS component and across the wafer to result in a desired stack stress locally and globally. For example, the MEMS stack can be tuned by the stress compensation layer to have a desired stack stress for the MEMS stack across the device and across the wafer.

The stress compensation layer may be configured to balance the stress in the different regions of the target layer to produce the desired stack stress value. For example, the stress compensation layer may be configured to produce an almost zero residual stress in the different target layer regions. Configuring the stress compensation layer to produce other desired stack stress values may also be useful.

In one embodiment, as discussed, the stress compensation layer, as deposited, has a thickness which is tailored to balance the target layer stress to the desired stack stress value in the target layer region with the highest target layer stress. For example, the stress compensation layer balances the target layer stress in the first target layer regions. As for the other target layer regions, such as the second target layer regions, the stress compensation layer is processed to balance the target layer stress in those regions. Processing includes trimming the stress compensation layer appropriately to balance the target layer stress in the other target layer regions.

In one embodiment, trimming the stress compensation layer to balance a target layer region, such as a second target layer region, is performed uniformly. For example, the stress compensation layer in the compensation layer region 274 is trimmed to recess the stress compensation layer to balance the target layer stress in target layer regions 254. The trimming forms mesas in compensation layer regions 272 and recesses in compensation layer regions 274, forming a non-planar topography in the stress compensation layer. Although, as shown, the target layer includes first and second target layer regions across the wafer, it is understood that the target layer may include other number of target layer regions. In this case, the regions of the stress compensation layer corresponding to the regions other than the first and second target layer regions may be trimmed to form recesses having different depths than the compensation layer regions 274. For example, the recesses of these regions may have shallower or deeper recesses than the compensation layer regions 274. In one embodiment, trimming is achieved using mask and etch techniques. For example, a RIE or wet etch using a patterned resist mask is performed to trim the compensation layer regions 274. In the case of a wet etch, rounded corners may result in the bottom of the recesses.

In other embodiments, the stress compensation layer, as deposited, is greater in thickness than necessary to balance the target layer stress to the desired stack stress value in the target layer region with the highest target layer stress. The stress compensation layer is trimmed in the various regions to balance the target layer stress to the desired stack stress value. For example, the compensation layer regions 272 and 274 are trimmed to form grated patterns to balance the target layer stress in the target layer. Trimming is achieved with mask and etch techniques, as previously described.

Figure 3A:
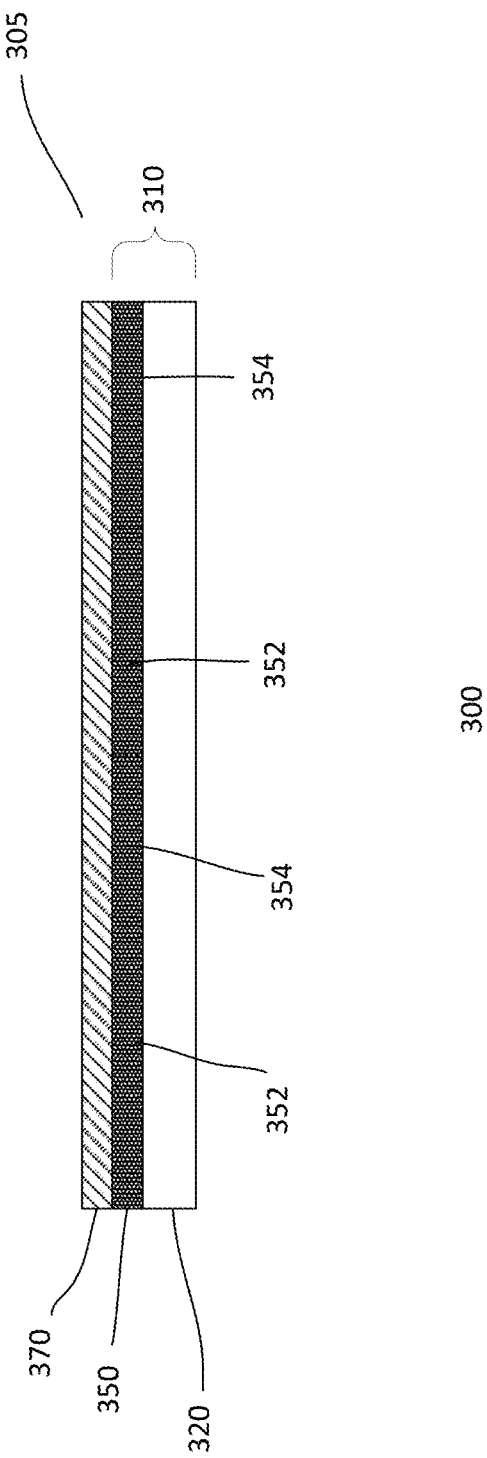
FIGS. 3a-3b show cross-sectional views of an embodiment of a process for forming a device.
Figure 3B:
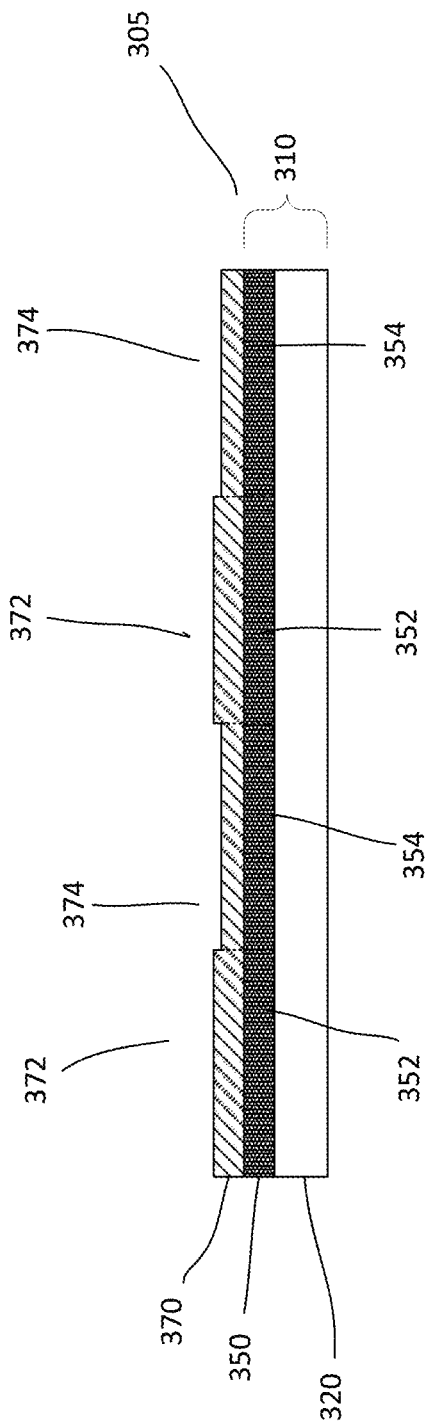

FIGS. 3a-3b show cross-sectional view of an embodiment of a process 300 for forming a device. The device may be a MEMS device. Other types of devices may also be useful. The device may be formed on a substrate. The substrate may be a silicon wafer on which numerous MEMS devices are formed. Other substrates may also be useful. The substrate, for example, may be silicon-on-insulator, germanium, silicon carbide, glass, quartz or other types of wafers. The MEMS device, for example, is disposed on the substrate. The substrate should be sufficiently thick to support the MEMS device. For example, the substrate may be about 750 µm. Other thicknesses may also be useful.

Referring to FIG. 3a, a portion of a device with a MEMS stack 305 of a MEMS component, such as a free-standing structure with arbitrary clamping and geometry, is shown. The MEMS component may be a cantilever structure. Other types of structures may also be useful. As shown, the MEMS stack includes a target layer 310 and a stress compensation layer 370. Providing the MEMS stack with other layers may also be useful.

The MEMS stack includes a target layer 310 and a stress compensation layer 370. The target layer may be an active layer of the MEMS component. The target layer may be a single target layer or a target stack with multiple target layers. Various types or number of target layers may be used, depending on the type of MEMS components. Examples of target layers may include aluminum nitride (AlN), aluminum oxide ($Al_2O_3$), tantalum (Ta), silicon (Si), silicon nitride ($Si_3N_4$), silicon oxide ($SiO_2$), ruthenium (Ru), tungsten (W), molybdenum (Mo), copper (Cu), nickel iron (NiFe), cobalt nickel iron (CoNiFe), glass, quartz, lithium tantalum oxide ($LiTaO_3$), lithium niobium oxide ($LiNbO_3$), silicon chromium (SiCr), tungsten carbide (WC), zinc oxide (ZnO), or a combination thereof.

The target layer, illustratively, is a target stack having first and second target layers 320 and 350. Providing a target stack with other number of target layers, including 1, may also be useful. In one embodiment, target stack may be a Si/AlN stack. For example, the first target layer may be a Si layer and the second target layer may be an AlN layer. The target thickness of the layer may be 3 µm while the target thickness of the AlN layer may be 1 µm. In other embodiments, for example, the target layer may be a Mo/AlN/Mo/AlN stack. The target thickness of the AlN layers may be about 1 µm and the target thickness of the Mo layers may be about 20 nm. In yet other embodiments, the target layer may be a $SiO_2$/Si/Mo/AlN/Mo stack. The $SiO_2$ and Si of the target stack may be a part of a SOI substrate. The $SiO_2$ layer may have a target thickness of about 1 µm, the target thickness of the Si layer may be about 4 µm, the target thickness of the first Mo layer may be about 200 nm, the target thickness of the AlN layer may be about 800 nm, and the target thickness of the second Mo layer may be about 100 nm. Other thicknesses or configurations of the target layers may also be useful, depending on the MEMS component.

In one embodiment, prior to forming or depositing a target layer, local thickness and stress measurements of an underlying layer across the wafer are obtained. Likewise, after depositing a target layer, local thickness and stress measurements of the target layer across the wafer are obtained. For example, pre-deposition local thickness and stress measurements of a target layer below and post-deposition local thickness and stress measurements of a target layer may be performed across the wafer. The stress of a layer may be measured by measuring the wafer curvature using a laser. Other techniques for measuring and determining stress of a target layer may also be useful. Locally measuring thickness and stress of a layer before and after deposition enables the thickness and stress of a target layer to be determined or calculated across the wafer. In a preferred embodiment, pre-deposition and post-deposition of local thickness and stress measurements are performed.

In the case of multiple target layers, a post-deposition thickness and stress measurement of an underlying layer may be used as a pre-deposition thickness and stress measurements of an overlying layer. Locally measuring thickness and stress of a layer before and after deposition of each layer enables the thickness and stress of each target layer to be determined or calculated across the wafer. In other embodiments, the thickness and stress of the overall stack may be measured after the stack of layers is formed to determine the overall stress of the stack. Other techniques for measuring thickness and stress of a layer or a stack of layers may also be useful.

Optionally, after performing post-deposition thickness and stress measurements across the wafer map, a target layer may be trimmed. For example, based on the measured thicknesses across the wafer map, the target layer may be trimmed to the target thickness. As discussed, a deposited target layer may have a non-uniform thickness across the wafer. Using the measured local thicknesses, the target layer may be trimmed to produce a uniform thickness in the target layer across the wafer. Trimming may be performed by ion beam trimming. For example, the target layer may be trimmed using maskless ion beam trimming. Other trimming techniques may also be useful. The thickness and stress of the trimmed target layer may be optionally re-measured after trimming. The trimming and re-measuring thickness and stress may be repeated until the desired uniformity in thickness is achieved. However, trimming and re-measuring thickness and stress of the target layer should be sufficient. Furthermore, in the case of a target stack with multiple target layers, none, one, some or all of the layers may be trimmed.

In an exemplary embodiment, the first target layer may be a Si layer. As for the second target layer, it may be an AlN layer. The AlN layer may include, for example, a tensile stress. Providing a target layer with compressive stress may also be useful. Stress calculations from pre-deposition and post-deposition thickness and stress measurements result in the second target layer having first and second set of local target layer regions 352 and 354 with different stress magnitudes across the wafer map. For example, the target layer has a non-uniform stress distribution, with first target regions having a target layer stress of about +160 MPa second target layer regions having a target layer stress of about +150 MPa.

In the exemplary embodiment, the second target layer is illustrated with first and second stress regions having different stresses. For example, first and second stress regions are distributed across the wafer. However, it is understood that a target layer may have other number of stress regions with different stresses. For example, all the regions may have different stresses or some may have different stresses and some may have the same stress.

Based on the measured thickness and curvature measurement of the target layer, target stress in the target layer across the wafer map is calculated. Based on the calculated stress, a stress compensation layer is formed on the target layer. The stress compensation layer includes a layer with a compensation stress which is of the opposite type as that of the target layer. For example, in the case of a target layer with tensile stress, the stress compensation layer is selected to have compressive stress. Preferably, the stress compensation layer includes a high stress level with uniform stress distribution. In one embodiment, the stress compensation layer includes a silicon nitride layer with compressive stress to balance the tensile stress in the target layer across the wafer. Other types of stress compensation layers, depending on the type of stress desired, may also be useful. The silicon nitride layer may be formed by plasma enhanced chemical vapor deposition (PECVD).

The stress compensation layer, as formed, has a thickness sufficient to compensate the target layer stress in the target layer regions with the largest stress magnitude. For example, the thickness of the stress compensation layer, as formed, is equal to a thickness to balance the stress in the target layer regions having the highest stress magnitude. In other embodiments, the thickness of the stress compensation layer may be greater than that needed to balance the stress in the target layer regions having the highest stress magnitude. The thickness may depend on the material and target layer stress with the highest stress magnitude.

After forming the stress compensation layer, the thickness and stress of the stress compensation layer across the wafer are respectively measured and calculated, similar to measuring the thickness and calculating the stress of the target layer. Together with the measured thickness and calculated stress of the target layer or each target layer, the measured thickness and stress of the compensation layer across the wafer are employed to generate a target thickness map of the stress compensation layer to produce a MEMS stack with the desired stack stress. For example, the thickness map maps the target thicknesses of the stress compensation layer across the wafer to produce the desired stack stress value. The target thickness of the stress compensation layer in the different target regions balances the stress to produce the desired stack stress value. In one embodiment, the desired stack stress value results in the MEMS stack having about zero residual stress, producing about a flat MEMS stack. Other desired stack stress values may also be useful.

Referring to FIG. 3b, the stress compensation layer is trimmed based on the target thickness map. For example, the stress compensation layer is trimmed to obtain the target thickness of the stress compensation layer in the different regions 372 and 374 across the wafer. In one embodiment, localized trimming is performed to produce a stress compensation layer with different thicknesses in different regions across the wafer according to the thickness target map. This creates a topography in the stress compensation layer. For example, the first and second target layer regions have different thicknesses according to the target thickness map. As a result, the stress compensation layer has a non-planar topography or uneven top surface. As shown, the non-planar topography across the wafer is a stepped topography. In other embodiments, the trimming results in the stress compensation layer having a non-planar topography with gradual change thickness across the wafer.

The target layer illustratively includes first and second regions 352 and 354 with different stresses. For example, two first regions and two second regions with a second stress are shown. The two first regions have the same stress (first stress) and the two second regions have the same stress (second stress). The first and second stresses are different. In other cases, all the regions may have different stresses. For example, the two first regions and two second regions each has a different stress. In such a case, the thickness of the stress compensation layer in each of the local regions will be different.

In one embodiment, trimming includes ion beam milling or trimming. The ion beam trimming may be maskless. For example, localized ion beam trimming is performed in the different regions or locations according to the target thickness map. The amount of stress compensation layer to be removed in the different spatial locations may be programmed into the ion beam trimming system. In the case that the thickness of the stress compensation layer is equal to the target thickness of the target layer with the highest magnitude of stress, the regions of the stress compensation layer corresponding to the target layer regions with the highest stress magnitude of target layer stress need not be trimmed. In other embodiments, the ion beam trimming may employ a trimming mask, such as a photoresist trimming mask.

In some embodiments, multiple-pass ion beam trimming may be performed. For example, ion beam trimming may be performed multiple times. After each pass, the thickness and stress of the stress compensation layer may be measured. Based on the thickness measurements, the next pass trims the stress compensation layer accordingly. The multiple-pass ion beam trimming enables refining the stress compensation layer thickness to ensure compliance with the target map.

In yet other embodiments, trimming may be performed by mask and etch techniques, such as a wet etch or a dry etch using a patterned resist mask. In the case of mask and etch techniques, multiple mask and etch processes may be employed to provide localized trimming if the target thickness map requires more than one region to be trimmed. Other types of trimming techniques may also be employed. In some embodiments, after each mask and etch process, the thickness of the stress compensation layer may be measured for compliance in the local regions which has been trimmed. An additional etch using the same mask may be performed to ensure compliance of thickness in the local regions.

After trimming the compensation layer, the process continues to form the device. For example, the process continues to form the MEMS device. The process may include releasing the MEMS structure, encapsulation and other processes to complete the MEMS device.

Figure 3C:
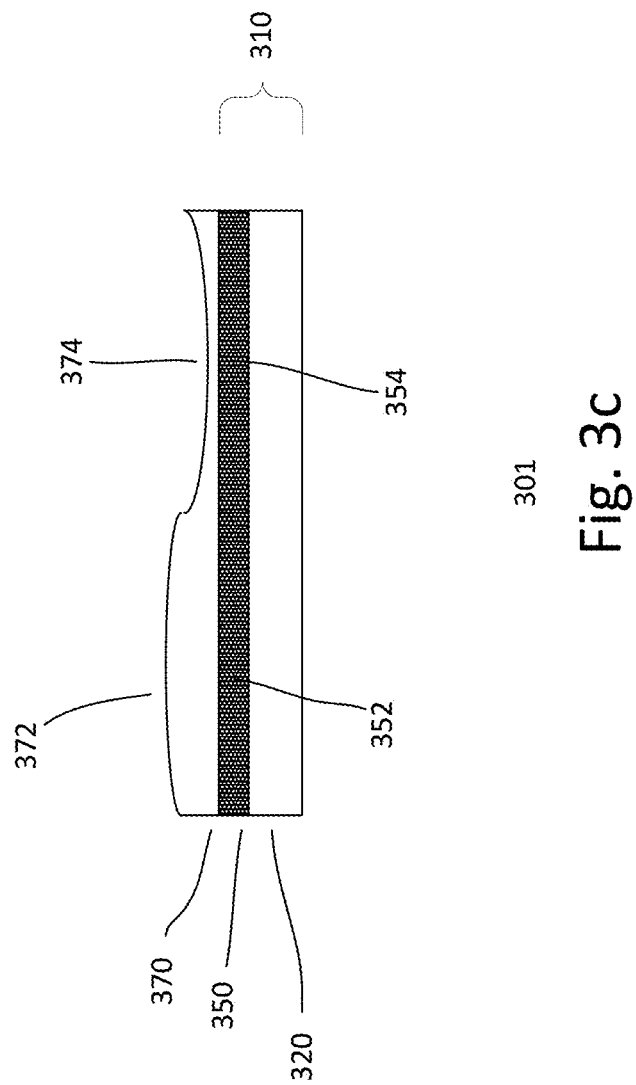
FIG. 3c shows a simplified cross-sectional view of a die.

FIG. 3c shows a cross-sectional view of an exemplary die 301. The die, for example includes a target layer 310, similar to that described in FIGS. 3a-b. Common elements may not be described or described in detail. The target layer, for example, is a target stack which includes a first target layer, such as Si and a second target layer, such as AlN. The second target layer includes first and second stress regions 352 and 354. A stress compensation layer 370 over the target stack is trimmed according to a target thickness map. As shown, the trimming forms a gradual change in thickness form the first to the second region. Providing gradual change in thickness provides a smooth stress transition from one stress region to the other.

FIGS. 4a-4d show cross-sectional view of another embodiment of a process 400 for forming a device. The process may be similar to that described in FIGS. 3a-b. Common elements of the process may not be described or described in detail.

The device may be a MEMS device. The device may be formed on a substrate. The substrate may be a silicon wafer on which numerous MEMS devices are formed. Other substrates may also be useful.

Figure 4A:
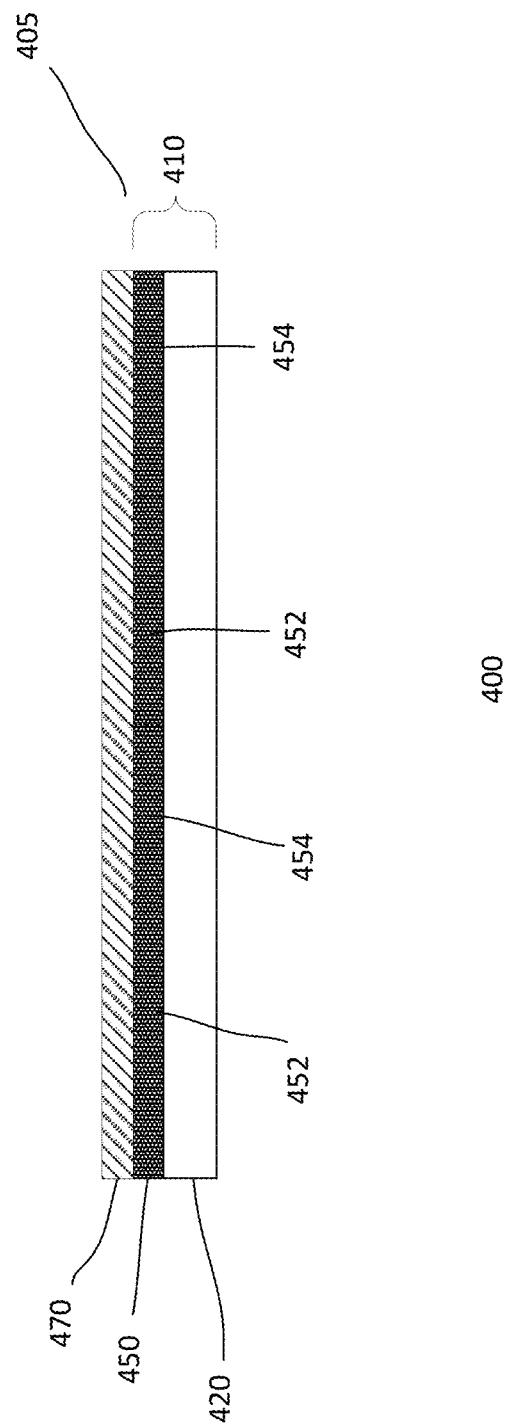
FIGS. 4a-4d show cross-sectional views of another embodiment of a process for forming a device.

Referring to FIG. 4a, a portion of a device is shown. The device is at the stage of processing similar to that described in FIG. 3b. For example, the device includes a MEMS stack 405 of a MEMS component, such as a free-standing structure with arbitrary clamping and geometry. A target layer 410, as shown, includes a target stack with first and second target layers 420 and 450. The first target layer may be a Si layer and the second target layer may be a AlN layer. Other types or configurations of target layers may also be useful. The target layer includes first and second target layer regions 452 and 454 with first and second target layer stresses. A stress compensation layer 470, such as SiN, is formed over the target layer.

Furthermore, the target thickness map is generated. The target thickness map is generated base on the target layer thickness and stress measurements as well as the thickness and stress measurements of the stress compensation layer and the type of stress compensation layer used. In one embodiment, the target thickness map determines target thicknesses of the stress compensation layer based on non-uniform trimming within a location of a stress compensation layer.

Figure 4B:
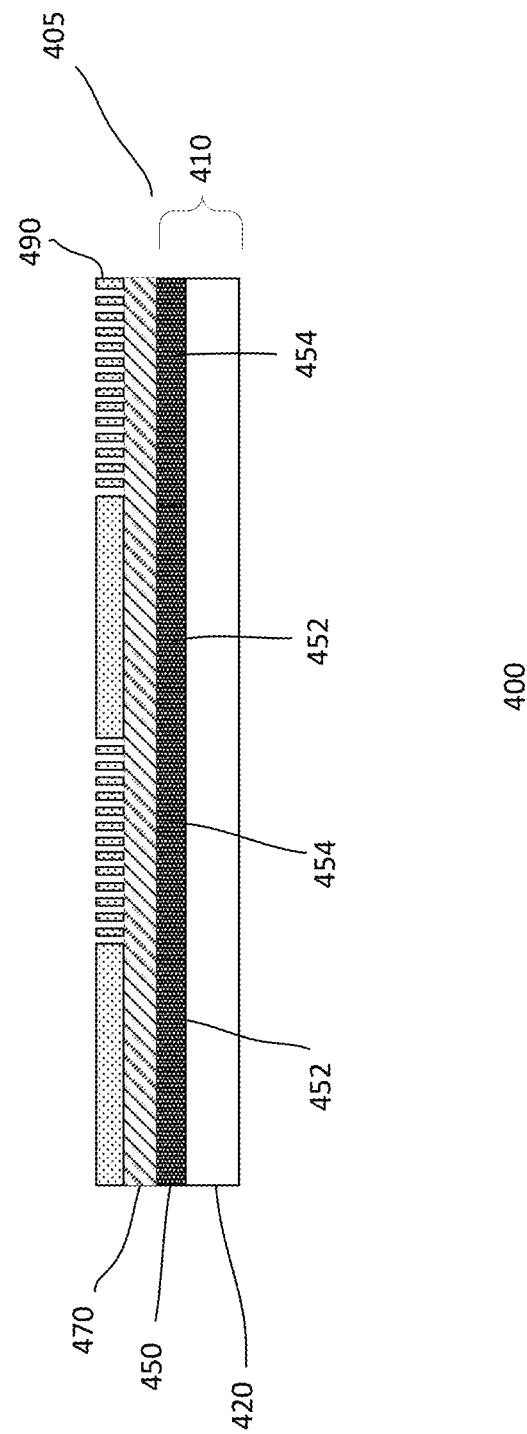

Referring to FIG. 4b, a trim mask layer 490, such as a photoresist layer, is formed on the stress compensation layer. The mask layer is patterned to form a trim mask, exposing the portions of the stress compensation layer to be trimmed. The trim mask patterned is patterned by, for example, exposing the mask layer with an exposure source through a reticle containing a desired pattern. After exposure, the mask layer is developed, transferring the pattern of the reticle to the resist, forming a patterned trim mask. The patterned trim mask exposes areas of the stress compensation layer to be trimmed.

Figure 4C:
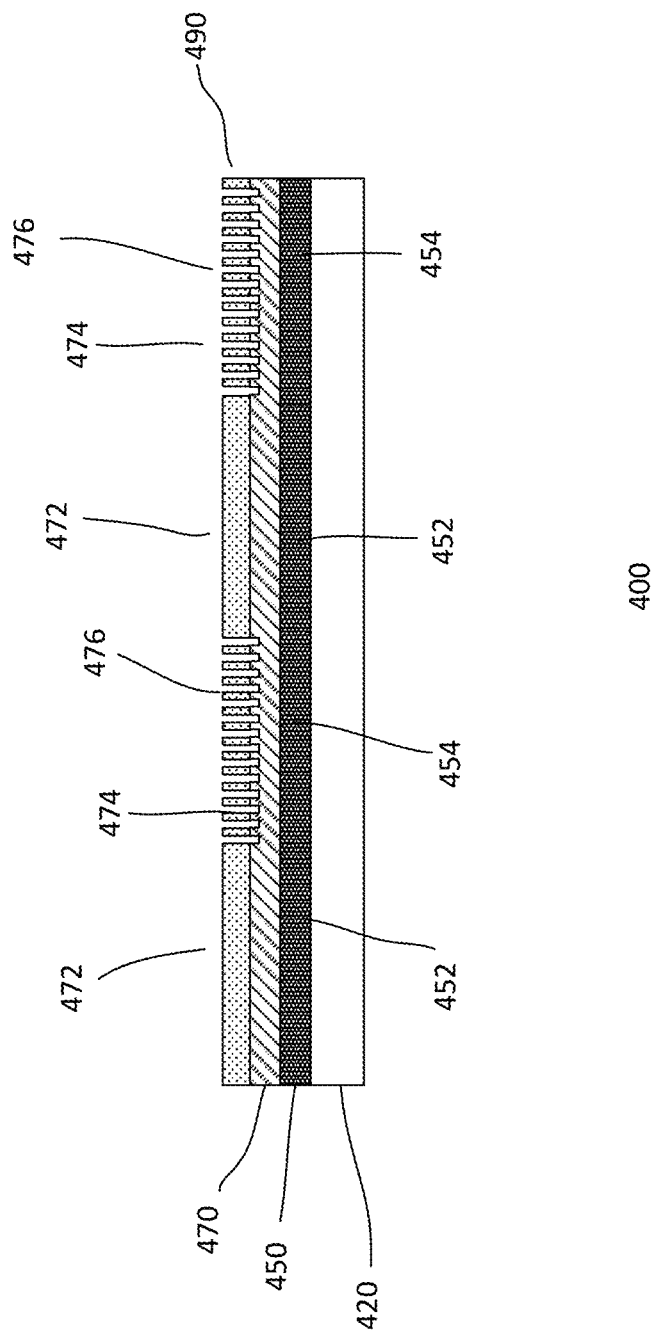

In FIG. 4c, the stress compensation layer is trimmed using the patterned trim mask based on the target thickness map. For example, stress compensation layer is trimmed to obtain the target thickness of the stress compensation layer in the different regions across the wafer. In one embodiment, localized trimming is performed to produce a stress compensation layer with different compensation stress in different regions across the wafer according to the target thickness map.

As shown, trimming the stress compensation layer to balance a target layer region is performed by ion beam trimming. The ion beam trimming trims a region of the compensation layer non-uniformly using the trim mask. For example, the compensation layer in compensation layer region 474 is trimmed to form a grated pattern 476. The grated pattern includes mesas and recesses or trenches in the compensation layer, forming a topography in the compensation layer over the target layer region which is trimmed. The grating may be configured to be along a direction of the MEMS structure or perpendicular to the direction of the MEMS structure. In the case of a cantilever, the grating may be configured for directional tuning purposes. For example, the cantilever having a grating along the direction of the cantilever member is more rigid than the cantilever having a grating across the direction of the cantilever member. Other configurations of grating may also be useful. For example, grated patterns are formed in the compensation layer regions 474 to balance the target layer stress in the second target regions 454.

The target layer illustratively includes first and second regions 452 and 454 with different stresses. For example, two first regions and two second regions with a second stress are shown. The two first regions have the same stress (first stress) and the two second regions have the same stress (second stress). The first and second stresses are different. In other cases, all the regions may have different stresses. For example, the two first regions and two second regions each has a different stress. In such a case, the thickness of the stress compensation layer in each of the local regions will be different.

As for compensation layer regions 472, there is no need for trimming since the layer is tailored already to balance the target layer stress in the first target layer regions or the first target regions 452 corresponding to the compensation layer regions 472 are non-releasing areas which do not need stress compensation. Alternatively, if trimming is necessary in the first target regions, the trimming may be uniform or non-uniform. For uniform trimming, the trim mask exposes the stress compensation layer over the first target layer regions. For non-uniform trimming, the trim mask exposes the stress compensation layer over the first target layer regions, similar to that over the second target layer regions.

In some embodiments, multiple-pass ion beam trimming may be performed. For example, ion beam trimming may be performed multiple times. After each pass, the thickness of the stress compensation layer may be measured. Based on the thickness measurements, the next pass trims the stress compensation layer accordingly. The multiple-pass ion beam trimming enables refining the stress compensation layer thickness to ensure compliance with the target map.

In other embodiments, the trimming may be by a wet or dry etch using the trim mask. In the case of mask and etch techniques, multiple mask and etch processes may be employed to provide localized trimming if the target thickness map requires more than one region to be trimmed. Other types of trimming techniques may also be employed. Multiple-pass etch processes may be performed to refine the thickness of the stress compensation layer for each target layer region type.

Figure 4D:
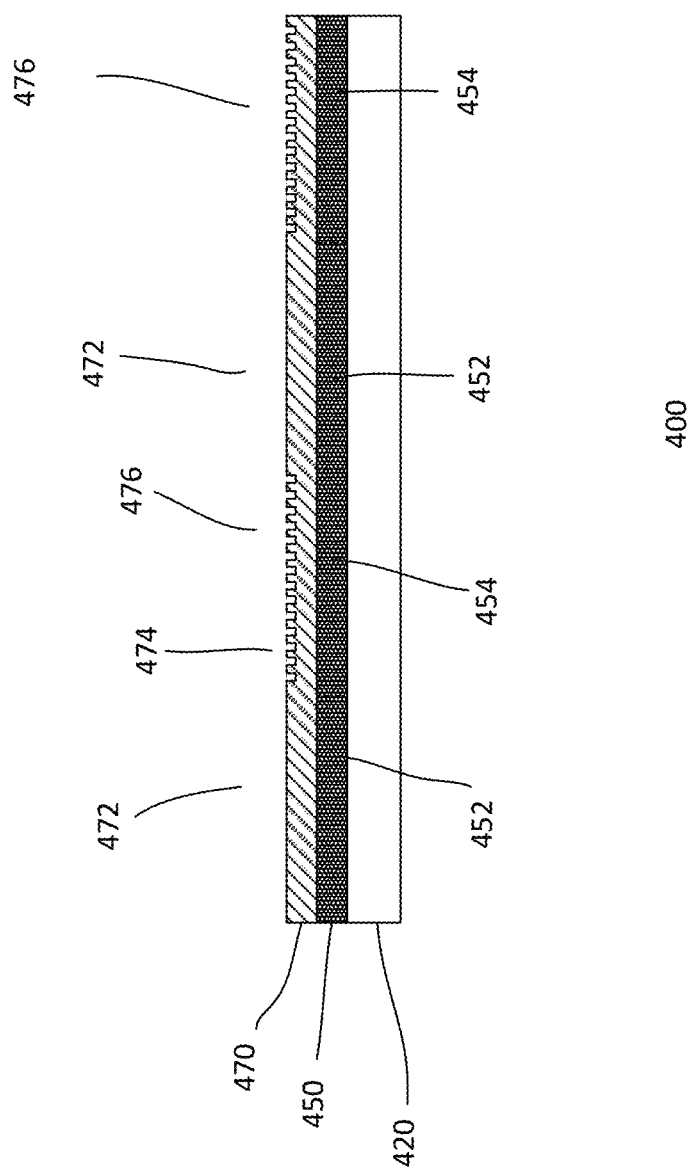

In FIG. 4d, the trim mask is removed. For example, the trim mask is removed by ashing. Other techniques for removing the trim mask may also be useful. After removal of the trim mask, the process continues to form the MEMS device. For example, the process may include releasing the MEMS structure, encapsulation and other processes to complete the MEMS device.

FIGS. 5a-5d show cross-sectional view of another embodiment of a process 500 for forming a device. The process may be similar to that described in FIGS. 3a-3b and 4a-4d. Common elements of the process may not be described or described in detail.

The device may be a MEMS device. The device may be formed on a substrate. The substrate may be a silicon wafer on which numerous MEMS devices are formed. Other substrates may also be useful.

Figure 5A:
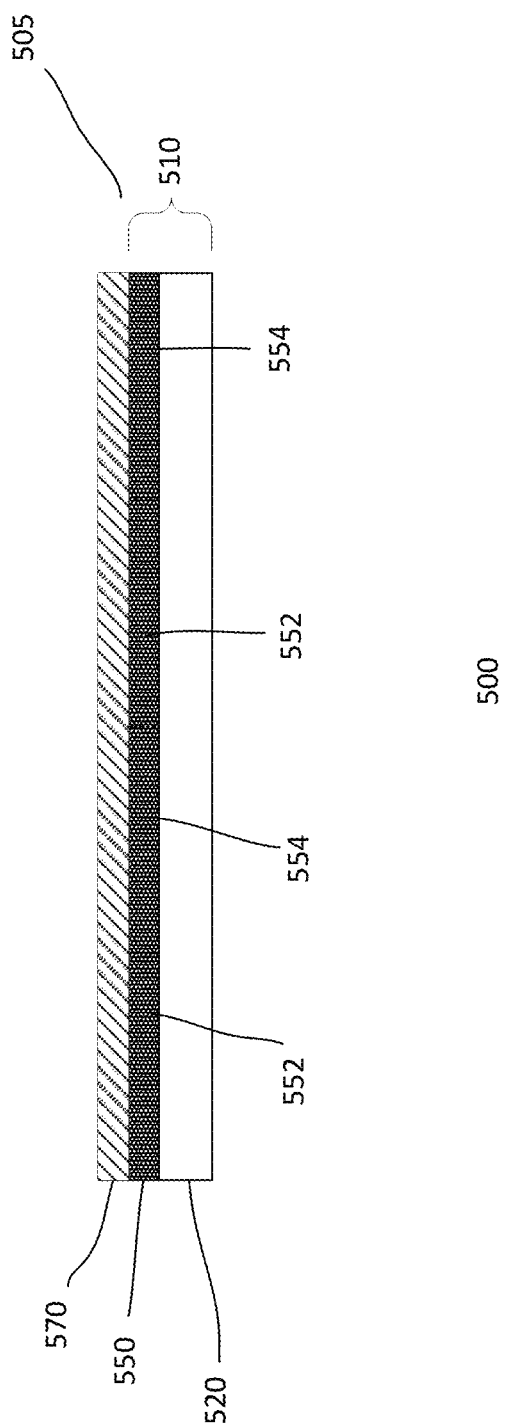

Referring to FIG. 5a, a portion of a device with a MEMS stack is shown. The device is at the stage of processing similar to that described in FIGS. 3b and 4a. For example, the device includes a MEMS stack 505 of a MEMS component, such as a free-standing structure with arbitrary clamping and geometry. A target layer 510, as shown, includes a target stack with first and second target layers 520 and 550. The first target layer may be a Si layer and the second target layer may be an AlN layer. Other types or configurations of target layers may also be useful. The target layer includes first and second target layer regions 552 and 554 with first and second target layer stresses. A stress compensation layer 570, such as SiN, is formed over the target layer.

Furthermore, the target thickness map is generated. The target thickness map is generated base on the target layer thickness and stress measurements as well as the thickness and stress measurements of the stress compensation layer and the type of stress compensation layer used. In one embodiment, the target thickness map determines target thicknesses based on uniform trimming within a location of a compensation layer.

Figure 5B:
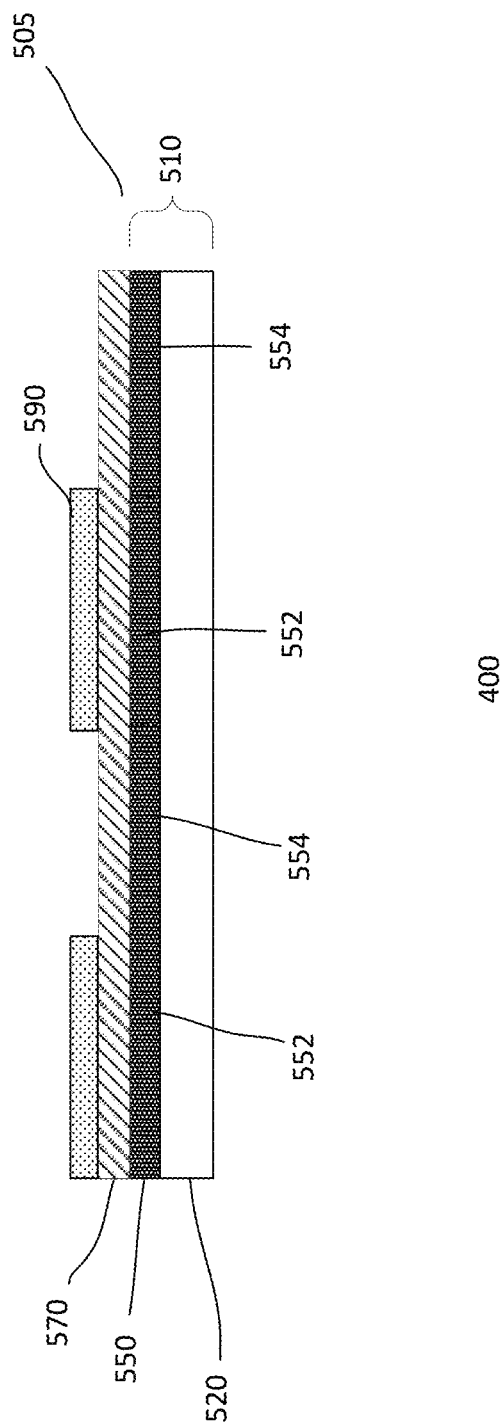

Referring to FIG. 5b, a trim mask layer 590, such as a photoresist layer, is formed on the stress compensation layer. The mask layer is patterned to form a trim mask, exposing the portions of the stress compensation layer to be trimmed. The trim mask patterned is patterned by, for example, exposing the mask layer with an exposure source through a reticle containing a desired pattern. After exposure, the mask layer is developed, transferring the pattern of the reticle to the resist, forming a patterned trim mask. The pattern trim mask exposes areas of the stress compensation layer to be trimmed.

In FIG. 5c, the stress compensation layer is trimmed using the trim mask based on the target thickness map. For example, stress compensation layer is trimmed to obtain the target thickness of the stress compensation layer in the different regions across the wafer. In one embodiment, localized trimming is performed to produce stress compensation layer with different thicknesses in different regions across the wafer according to the thickness target map. This creates a topography in the stress compensation layer. For example, the first and second compensation layer regions 572 and 574 over the first and second target layer regions 552 and 554 have different thicknesses according to the target thickness map, resulting in steps in the stress compensation layer.

In one embodiment, the trimming is performed by an etch, such as a wet etch. Performing the trimming by a dry etch, such as RIE, may also be useful. The etch trims the stress compensation layer exposed by the trim mask. For example, the stress compensation layer over the second target layer regions is recessed according to the target thickness map. As shown, the etch can only trim regions across the wafer exposed by the trim mask. If other regions need to be trimmed differently, separate etch processes may be employed using different trim masks.

As for the compensation layer regions 572, there is no need for trimming since the layer is tailored already to balance the target layer stress in the first target layer regions or the first target regions 552 corresponding to the compensation layer regions 572 are non-releasing areas which do not need stress compensation. Alternatively, if trimming is necessary in the first target regions, the trimming may employ a separate mask and etch process.

Figure 5D:
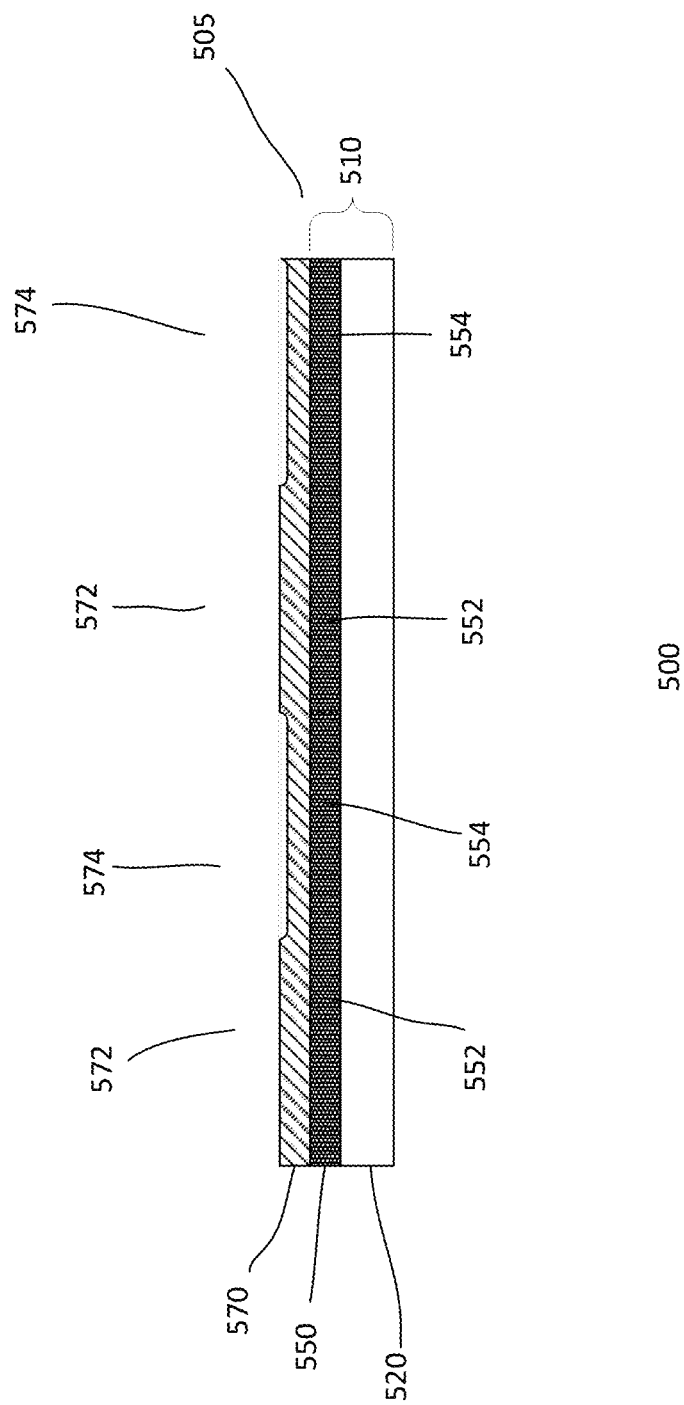

In FIG. 5d, the trim mask is removed. For example, the trim mask is removed by ashing. Other techniques for removing the trim mask may also be useful. After removal of the trim mask, the process continues to form the MEMS device. For example, the process may include releasing the MEMS structure, encapsulation and other processes to complete the MEMS device.

Figure 6A:
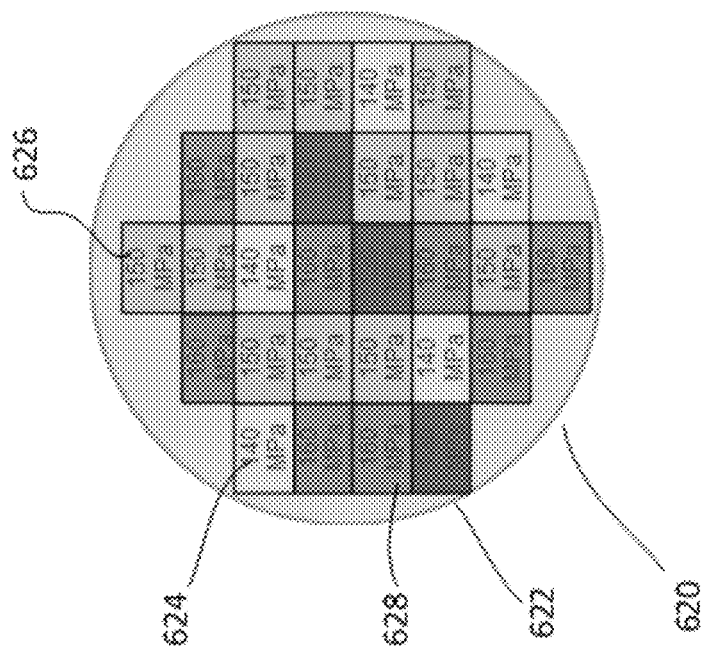
FIGS. 6a-6c show thickness and stress maps.
Figure 6A:
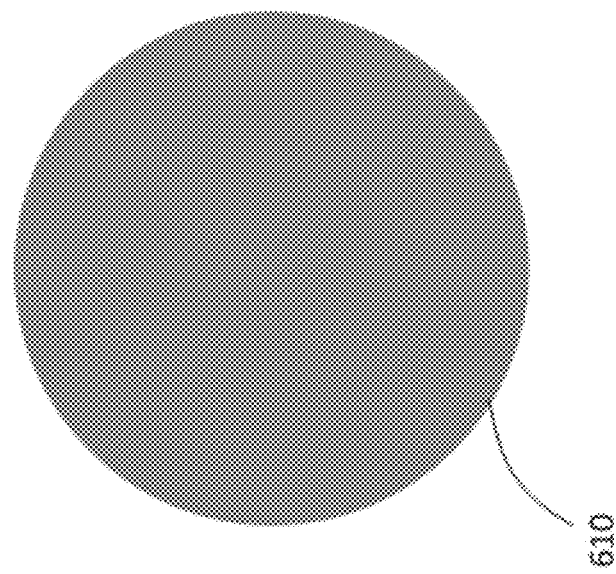
Figure 6B:
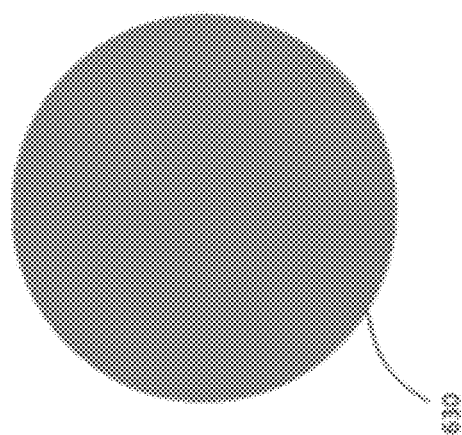
Figure 6C:
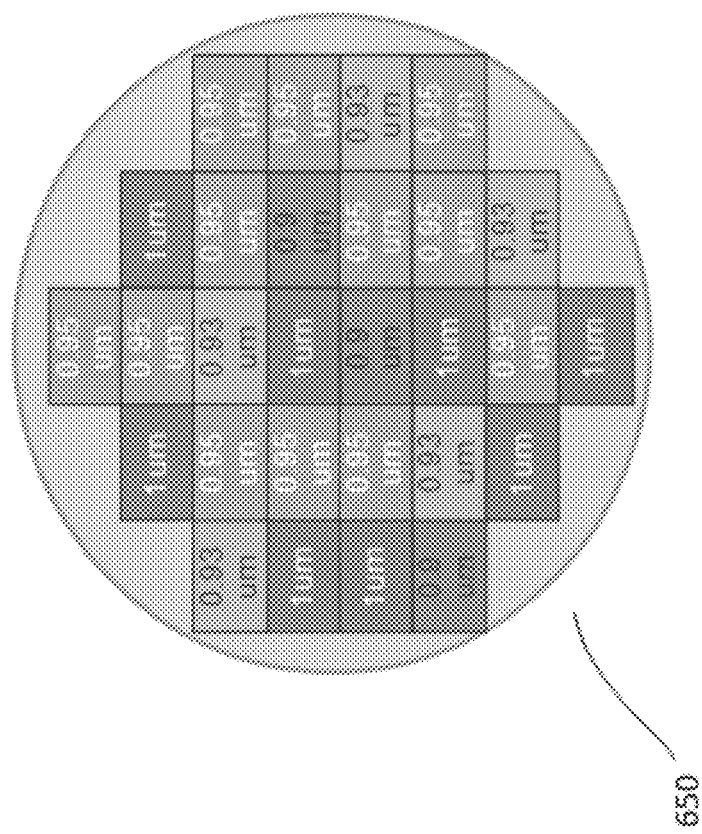

FIGS. 6a-6c show thickness and stress maps. Referring to FIG. 6a, a thickness map 610 for the target layer is shown. The thickness map, for example, illustrates a 1 µm thick AlN target layer. Other types of target layers or target layer stacks may also be useful. The corresponding stress map 620 of the target layer shows that different target regions across the wafer have different target layer stress magnitudes or values. As shown, target layer regions 622, 624, 626 and 628 having +130 MPa, +140 MPa, +150 MPa and +160 MPa are distributed across the wafer.

As for FIG. 6b, it shows a thickness map 630 for the stress compensation layer. The thickness map, for example, illustrates a 1 µm thick silicon nitride stress compensation layer. Assuming that the stress compensation layer has a uniform thickness, the compensation layer stress should be uniform across the wafer. For a 1 µm thick silicon nitride layer, the stress is −90 MPa.

Based on the thickness and stress maps of the target and stress compensation layers, a target thickness map 650 for the stress compensation layer can be calculated, as shown in FIG. 6c. The target thickness of the stress compensation layer is calculated to balance the stress of the MEMS stack across the wafer to a desired stack stress. In one embodiment, the target stack stress results in almost zero residual stress in the MEMS stack. For example, the stress compensation layer regions over the target layer regions with +130 MPa has a target thickness of 0.9 µm; the stress compensation layer regions over the target layer regions with +140 MPa has a target thickness of 0.93 µm; the stress compensation layer regions over the target layer regions with +150 MPa has a target thickness of 0.95 µm; and the stress compensation layer regions over the target layer regions with +160 MPa has a target thickness of 1 µm. Using the target thickness map of the stress compensation layer, the stress compensation layer is trimmed to balance the stress to the desired stack stress across the wafer.

The embodiments as described above result in various advantages. For example, a global almost zero-residual stress can be achieved across the wafer map. The embodiments also offer unlimited choices of materials to be compensated and compensation layers. The embodiments also work well for MEMS devices having arbitrary clamping and geometry. For example, the embodiments work particularly well for critical cantilever applications, such as microphones, biosensors and etc., where flexural modes are used. Furthermore, as described, multilayer compensation is also feasible and readily achievable. The embodiments allow for multi-step trimming, which is compatible with in-line inspection.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A structure comprising:
a wafer; and
a first cantilever structure and a second cantilever respectively disposed in a first region and a second region on the wafer, the first cantilever structure and the second cantilever including different sections of a layer stack, the layer stack including a first target layer and a stress compensation layer disposed over the first target layer, the first target layer of the first cantilever including a first target stress and the first target layer of the second cantilever including a second target stress, the first target stress and the second target stress having respective first and second target stress magnitudes which are different, the stress compensation layer configured to reduce a difference between the first target stress and the second target stress.

2. The structure of claim 1 wherein the first cantilever and the second cantilever each include an elongated member having a first side, a second side, a first end, and a second end, the first end is attached to the wafer, and the first side, the second side, and the second end are released from the wafer.

3. The structure of claim 1 wherein the stress compensation layer includes a grating pattern in only the first region.

4. The structure of claim 1 wherein the stress compensation layer has a first thickness over the first region and a second thickness over the second region that at least in part reduces the difference between the first target stress and the second target stress.

5. The structure of claim 1 wherein the different sections of a layer stack further include a second target layer, the second target layer is disposed between the first target layer and the wafer, the first target layer is comprised of aluminum nitride, the second target layer is comprised of silicon, and the stress compensation layer is comprised of silicon nitride.

6. The structure of claim 1 wherein the first target layer is comprised of aluminum nitride, aluminum oxide, tantalum, silicon, silicon nitride, silicon oxide, ruthenium, tungsten, molybdenum, copper, nickel iron, cobalt nickel iron, glass, quartz, lithium tantalum oxide, lithium niobium oxide, silicon chromium, tungsten carbide, or zinc oxide.

7. The structure of claim 1 wherein the different sections of a layer stack further include a second target layer, the first target layer is comprised of a first material, and the second target layer is comprised of a second material different from the first material.

8. The structure of claim 7 wherein the first material is aluminum nitride, aluminum oxide, tantalum, silicon, silicon nitride, silicon oxide, ruthenium, tungsten, molybdenum, copper, nickel iron, cobalt nickel iron, glass, quartz, lithium tantalum oxide, lithium niobium oxide, silicon chromium, tungsten carbide, or zinc oxide.

9. The structure of claim 7 wherein the second material is aluminum nitride, aluminum oxide, tantalum, silicon, silicon nitride, silicon oxide, ruthenium, tungsten, molybdenum, copper, nickel iron, cobalt nickel iron, glass, quartz, lithium tantalum oxide, lithium niobium oxide, silicon chromium, tungsten carbide, or zinc oxide.

* * * * *